(12) United States Patent
Pei et al.

(10) Patent No.: US 9,852,982 B1
(45) Date of Patent: Dec. 26, 2017

(54) ANTI-FUSES WITH REDUCED PROGRAMMING VOLTAGES

(71) Applicant: GLOBALFOUNDRIES Inc., Grand Cayman (KY)

(72) Inventors: Chengwen Pei, Danbury, CT (US); Kangguo Cheng, Schenectady, NY (US); Juntao Li, Cohoes, NY (US); Geng Wang, Stormville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/189,432

(22) Filed: Jun. 22, 2016

(51) Int. Cl.
| | | |
|---|---|---|
| *H01L 23/52* | (2006.01) | |
| *H01L 23/525* | (2006.01) | |
| *H01L 29/78* | (2006.01) | |
| *H01L 27/112* | (2006.01) | |
| *H01L 29/06* | (2006.01) | |
| *H01L 29/66* | (2006.01) | |
| *H01L 21/265* | (2006.01) | |

(52) U.S. Cl.
CPC ........ *H01L 23/5252* (2013.01); *H01L 21/265* (2013.01); *H01L 27/11206* (2013.01); *H01L 29/0649* (2013.01); *H01L 29/66795* (2013.01); *H01L 29/785* (2013.01)

(58) Field of Classification Search
CPC .................................................. H01L 23/5252
USPC .......................................................... 257/401
See application file for complete search history.

(56) References Cited

U.S. PATENT DOCUMENTS

| | | | |
|---|---|---|---|
| 2010/0032732 A1 | 2/2010 | Booth, Jr. et al. | |
| 2011/0031582 A1 | 2/2011 | Booth, Jr. et al. | |
| 2013/0270559 A1* | 10/2013 | Hafez ............... | H01L 27/11206 257/50 |

* cited by examiner

*Primary Examiner* — Marc Armand
*Assistant Examiner* — Warren H Kilpatrick
(74) *Attorney, Agent, or Firm* — Thompson Hine LLP; Yuanmin Cai

(57) ABSTRACT

Device structures for an anti-fuse and methods for manufacturing device structures for an anti-fuse. The anti-fuse includes a first terminal comprised of a fin. The fin includes a section with an edge and inclined surfaces that intersect at the edge. The anti-fuse further includes a second terminal covering the edge and the inclined surfaces of the fin, and an isolation dielectric layer on the inclined surfaces and the edge of the fin. The second terminal is separated from the edge and inclined surfaces of the fin by the isolation dielectric layer. The edge and inclined surfaces on the firm may be formed by oxidizing an upper section of the fin in a trench to form an oxide layer, and then removing the oxide layer to expose the edge and inclined surfaces.

8 Claims, 3 Drawing Sheets

ANTI-FUSES WITH REDUCED PROGRAMMING VOLTAGES

BACKGROUND

The invention relates generally to semiconductor manufacturing and integrated circuits and, more particularly, to device structures for an anti-fuse and methods for manufacturing these device structures.

Anti-fuses are nonvolatile, once-programmable devices widely used, among other device applications, in programmable integrated circuits. A common use of anti-fuses is in redundancy circuits of dynamic random access memories and static random access memories. Another common use of anti-fuses is in programmable read-only memories and programmable logic devices (PLDs) to program logic circuits to create a customized design. Yet another common use of anti-fuses is to program the input/output (I/O) configuration of a memory device.

An anti-fuse is initially non-conductive at the time of its fabrication, but may be irreversibly programmed to create a permanent conductive link. In a common construction, an anti-fuse includes a pair of conductive terminals separated by a dielectric layer. To program an anti-fuse, a predetermined voltage is applied as a bias potential across the terminals so that an electrical current breaks down the dielectric layer and thereby significantly reduces the electrical resistance of the anti-fuse. The reduced electrical resistance of the dielectric layer creates a closed conductive link or short between the conductive terminals. Once programmed, the anti-fuse cannot be programmed back to an open state with a high electrical resistance. Programming voltages for anti-fuse structures may be on the order of four volts, which may make existing constructions for anti-fuses incompatible with advanced integrated circuit designs.

Improved structures for an anti-fuse and methods of fabricating an anti-fuse are needed.

SUMMARY

In an embodiment of the invention, an anti-fuse includes a first terminal comprised of a fin. The fin includes a section with an edge and a plurality of inclined surfaces that intersect at the edge. The anti-fuse further includes a second terminal covering the edge and the inclined surfaces of the fin, and an isolation dielectric layer on the inclined surfaces and the edge of the fin. The second terminal is separated from the edge and inclined surfaces of the fin by the isolation dielectric layer.

In an embodiment of the invention, a device structure includes an anti-fuse including a first terminal comprised of a first fin projecting from a substrate, a second terminal, and an isolation dielectric layer. The first fin includes a section with an edge and a plurality of inclined surfaces that intersect at the edge, and the second terminal covers the edge and the inclined surfaces of the first fin. The second terminal is separated from the edge and inclined surfaces of the fin by the isolation dielectric layer. The device structure further includes a fin-type field effect transistor with a second fin projecting from the substrate.

In an embodiment of the invention, a method is provided for forming an anti-fuse. The method includes forming a fin, forming a dielectric layer that embeds the fin, and forming a trench in the dielectric layer. The trench is aligned with the fin. A section of the fin is oxidized through the trench to form an edge, a plurality of inclined surfaces that intersect at the edge, and an oxide layer covering the edge and the inclined surfaces. The oxide layer is then removed from the edge and the inclined surfaces of the first fin to define a first terminal. The method further includes covering the edge and the inclined surfaces of the first fin with a second terminal and an isolation dielectric layer. The isolation dielectric layer is located between the edge and the inclined surfaces of the first fin and the second terminal.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
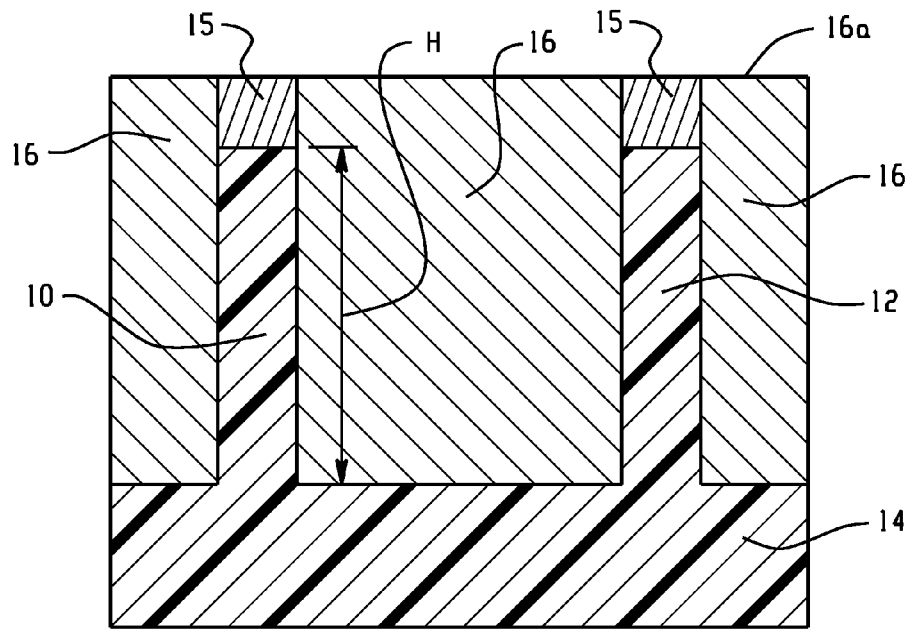
FIGS. 1-5 are cross-sectional views of a portion of a substrate at successive stages of a processing method in accordance with an embodiment of the invention.

With reference to FIG. 1 and in accordance with an embodiment of the invention, fins 10, 12 are formed from a semiconductor material of a substrate 14, which may be a bulk substrate or a device layer of a semiconductor-on-insulator (SOI) substrate. Each of fins 10, 12 is a three-dimensional body of semiconductor material originating from the substrate 14, and each may be covered by a respective cap 15. The fins 10, 12 may be formed by photolithography and etching processes, such as a sidewall imaging transfer (SIT) process that promotes dense packing. Although depicted as being adjacent to each other for purposes of illustration, the fin 10, as well as related fins like fin 10, may be located in different regions on the surface of the substrate 14 than the fin 12, as well as related fins like fin 12, but may be concurrently formed using some or all of the same processes. The fins 10, 12 have a rectangular shape in cross-section with a flat top surface and right angle corners at the edges of the flat top surface formed at the intersection with the sidewalls of the fins 10, 12. The sidewalls of each of the fins 10, 12 may be vertically oriented relative to (and project from) the top surface of the substrate 14, which is recessed when the fins 10, 12 are formed by etching to remove material between the fins 10, 12. The fins 10, 12 have an initial height H measured relative to the top surface of the substrate 14.

A dielectric layer 16 may be formed by depositing an electrical insulator to fill the open space surrounding the fins 10, 12, and planarizing the electrical insulator relative to the top surfaces of the caps 15 using, for example, chemical mechanical polishing (CMP). The dielectric layer 16 may be comprised of a dielectric material, such as an oxide of silicon (e.g., silicon dioxide ($SiO_2$)) deposited by chemical vapor deposition (CVD). Following planarization, the top surface of the caps 15 on fins 10, 12 and a top surface 16a of the dielectric layer 16 may be coplanar. The dielectric layer 16 is thicker than a height of the fins 10, 12 such that the fins 10, 12 are embedded in the dielectric layer 16. The thickness of the dielectric layer 16 may be equal to the height of the fins 10, 12 and their respective caps 15.

Figure 2:
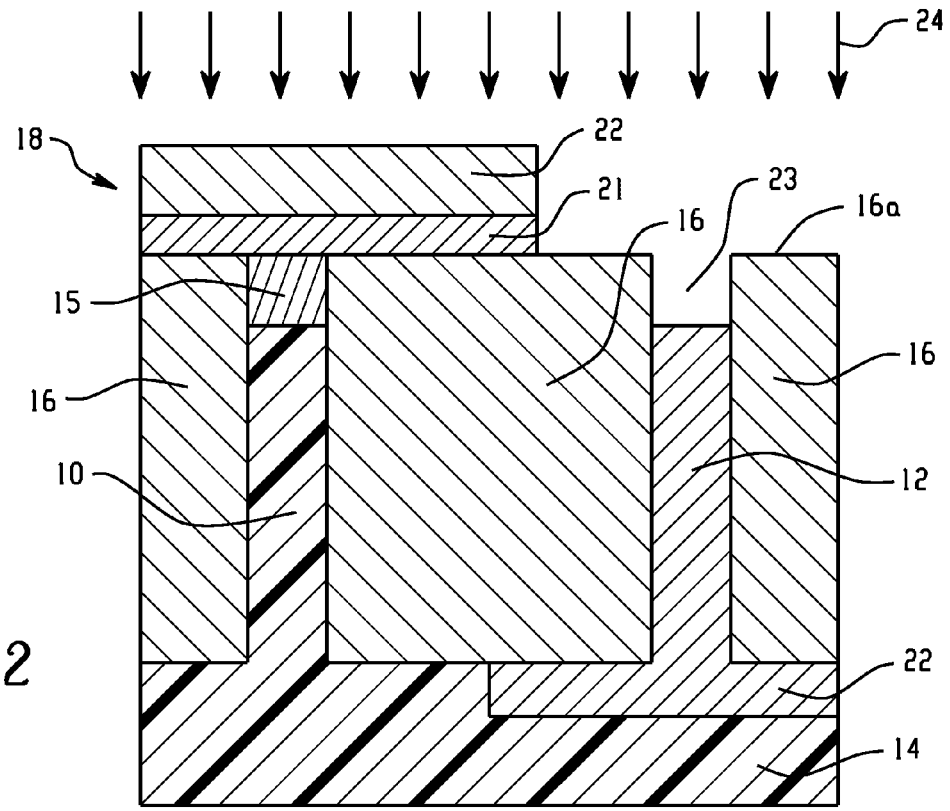

With reference to FIG. 2 in which like reference numerals refer to like features in FIG. 1 and at a subsequent fabrication stage, a sacrificial mask layer 18 may be applied to the planarized surfaces. The mask layer 18 may include, for example, a hardmask layer 20 and a photoresist layer 21 on top of the hardmask layer 20. The hardmask layer 20 may be comprised of an electrical insulator, such as silicon nitride ($Si_3N_4$), deposited by chemical vapor deposition. The photoresist layer 21 may be applied with a spin coating process, pre-baked, exposed to a radiation projected through a photomask, baked after exposure, and developed with a chemical developer to define a pattern with an opening localized over the fin 12.

An etching process may be used to remove the hardmask layer 20 from a location above the capped fin 12 and to remove the cap 15 from the top surface of fin 12. The etching process may be comprised of a wet chemical etch or a dry etch, and may rely on a given etch chemistry (e.g., hot phosphoric acid for a wet chemical etch) that removes the materials of the hardmask layer 20 and the cap 15 selective to (i.e., at a higher etch rate than) the material constituting the dielectric layer 16. The cap 15 is retained on fin 10, and the hardmask layer 20 over fin 10 is protected against removal by the protection afforded by the photoresist layer 21 during the etching process. The space formerly occupied by the cap 15 on the fin 12 defines a trench 23 in the dielectric layer that is aligned with the fin 12 and that extends along the length of the fin 12.

The fin 12 is doped over its entire height with an added dopant. The semiconductor material of the substrate 14 beneath the fin 12 is likewise doped to form a doped region 22 that has the same conductivity type as the fin 12. The fin 12 and doped region 22 may be formed by implanting energetic ions, which are indicated diagrammatically by singled-headed arrows 24, with one or more selected implantation conditions (e.g., ion species, dose, kinetic energy, angle of incidence). The ions 24 are stopped within the thickness of the mask layer 18 such that the fin 10 and the substrate 14 beneath fin 10 are not doped during the implantation. The ions 24 are energetic enough for at least one set of implantation conditions to penetrate through the thickness of the fin 12 and surrounding dielectric layer 16 so as to stop in the substrate 14 beneath the fin 12 and form the doped region 22. The perimeter of the doped region 22 in the substrate 14 may be aligned with the edges of the opening in the mask layer 18.

The ions 24 may be generated from a suitable source gas and implanted with the selected implantation conditions using an ion implantation tool. In an embodiment, the ions 24 may comprise an ion species that delivers a dopant from Group V of the Periodic Table (e.g., phosphorus (P), arsenic (As), or antimony (Sb)) in a concentration and with a depth profile that is effective to impart a designated n-type conductivity to the semiconductor material of the fin 12 and the semiconductor material of the substrate 14 in doped region 22. In another embodiment, the ions 24 may comprise an ion species that delivers a dopant from Group III of the Periodic Table (e.g., boron (B) or gallium (Ga)) in a concentration and with a depth profile that is effective to impart a designated p-type conductivity to the semiconductor material of the fin 12 and the semiconductor material of the substrate 14 in doped region 22. When the dopant is electrically activated, the fin 12 and doped region 22 may each have a reduced electrical resistance in comparison with the respective original electrical resistances of the fin 12 and the substrate 14. To that end, the dopant may be introduced by implantation to provide a high concentration, such as $5 \times 10^{18}$ $cm^{-3}$ to $1 \times 10^{21}$ $cm^{-3}$.

The doped fin 12 is electrically connected in series with the doped region 22. The doping operates to reduce the body resistance of both the fin 12 and the doped region 22. The doped region 22 may be used during device operation to transfer a programming voltage to the terminal of the anti-fuse defined by the fin 12.

The photoresist layer 21 may be removed following the ion implantation process. For example, ashing or solvent stripping may be used to strip the photoresist layer 21, followed by a conventional cleaning process.

Figure 3:
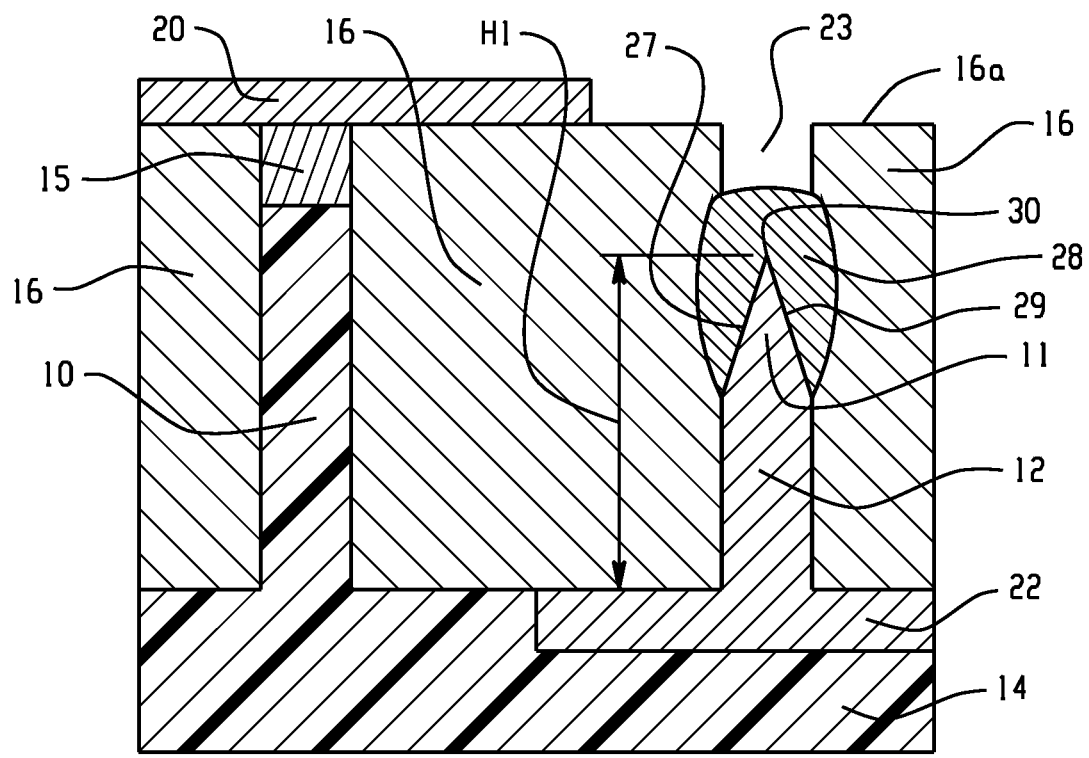

With reference to FIG. 3 in which like reference numerals refer to like features in FIG. 2 and at a subsequent fabrication stage, a portion of the upper section 11 of the fin 12 is oxidized to form an oxide layer 28 that includes, in part, material from the fin 12. In an embodiment, the oxide layer 28 may be comprised of silicon dioxide ($SiO_2$) grown by wet or dry thermal oxidation of the semiconductor material of fin 12. The oxidizing species accesses the fin 12 through the trench 23 resulting from the removal of the overlying section of the hardmask layer 20 and the removal of the cap 15 on fin 12. The oxidation of the fin 12 is influenced by the presence of the overlying trench 23 in dielectric layer 16. The oxidation rate is higher at the vertical interfaces between the fin 12 and the dielectric layer 16 inside the trench 23 than at other locations on the top surface of the fin 12. The oxidation rate is lowest at or near the vertical centerline of the fin 12 and trench 23 remote from the vertical interfaces. The oxidation process consumes the semiconductor material from the fin 12 to form the oxide layer 28. As a result, fin 12 is shortened by the oxidation sharpening such that its height is equal to H1, which is less than its initial height H (FIG. 1). The fin 10 retains the initial height H, which is greater than the height of the fin 12 as modified by the oxidation sharpening.

As a result of the differential oxidation rates at different locations inside the trench 23, the fin 12 acquires a non-planar topography in which its top surface includes inclined surfaces 27, 29 that are angled toward a center plane of the fin 12. The inclined surfaces 27, 29 are oriented and arranged to converge, as well as intersect, at an edge 30, which may be located at or near the vertical centerline of the fin 12. The inclined surfaces 27, 29 and edge 30 extend along the length of the fin 12, and the inclined surfaces 27, 29 now constitute the top surface of the fin 12. The initial rectangular shape of the upper section 11 of the fin 12 is modified by the oxidation sharpening such that the top surface is no longer planar and such that the right angle corners formerly adjacent to the dielectric layer 16 inside the trench 23 are eliminated. Instead of two edges at the right angled corners of a flat surface, the single edge 30 is formed at the intersection of the inclined surfaces 27, 29. The included angle between the inclined surfaces 27, 29 is less than 90°. The sidewalls of the fin 12 at a location below the upper section 11 remain oriented vertical to the top surface of the substrate 14 and contained in planes that are aligned parallel to each. In particular, a lower section of the fin 12, which is adjacent to the doped region 22 in substrate 14, is not oxidized and retains its original shape with vertical sidewalls. During this oxidation sharpening process, the fin 10 is protected against oxidation due to the coverage by the hardmask layer 20, and retains its initial as-formed rectangular shape.

Figure 4:
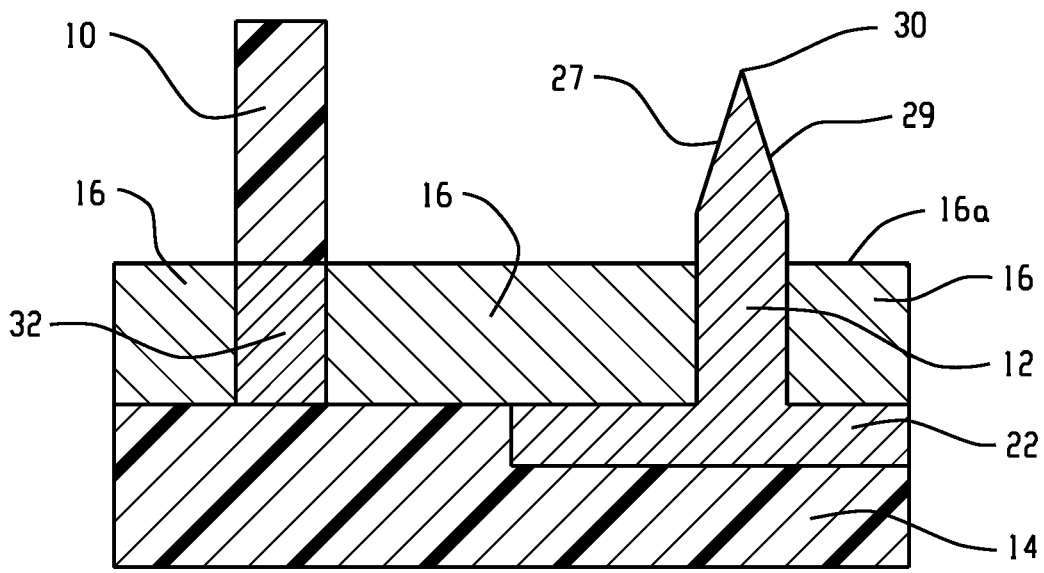

With reference to FIG. 4 in which like reference numerals refer to like features in FIG. 3 and at a subsequent fabrication stage, the residual hardmask layer 20 over the fin 10 may be removed using an etching process, such as a wet chemical etch or a dry etch, and may rely on a given etch chemistry (e.g., hot phosphoric acid for a wet chemical etch of silicon nitride). The etching process may remove the dielectric material of the hardmask layer 20 selective to (i.e., at a higher etch rate than) the dielectric material constituting the dielectric layer 16. In an embodiment, a wet chemical etching process may be used to recess the dielectric layer 16 and to remove the oxide layer 28 from fin 12. If the dielectric layer 16 and the oxide layer 28 are comprised of an oxide of silicon, the wet chemical etching process may utilize a wet chemical etchant containing hydrofluoric acid (HF).

The top surface 16a of the dielectric layer 16 is recessed by an etching process such that an upper section of the fin 10 and the upper section 11 of the fin 12 project above the top surface of the dielectric layer 16. The channel for a FinFET, which may be included in the body of fin 10, is located in the exposed upper section of fin 10. Generally, the fin 12 is shortened by the oxidation sharpening and is no longer the same height as fin 10. Specifically, the fin 12 projects by a shorter distance above the recessed top surface 16a of the dielectric layer 16 than the top surface of fin 10, which is a consequence of the oxidation sharpening used to form the edge 30 on fin 12.

A punchthrough stop layer 32 is formed in a lower section of the fin 10, and may be located below the recessed top surface of the dielectric layer 16. The punchthrough stop layer 32 has an opposite conductivity type from the channel of the fin 10. Fin 12 is masked by the oxide layer 28, and may be further masked by a resist layer (not shown) when forming the punchthrough stop layer in fin 10. The punchthrough stop layer 32 may suppress punchthrough leakage through dopant junction isolation. The punchthrough stop layer 32 may be formed by angled ion implantation in which the ion trajectories are inclined relative to the sidewalls of fin 10 and with a mask layer to prevent fin 10 from receiving an implanted ion concentration. Alternatively, the punchthrough stop layer 32 may be formed by outdiffusion from the dielectric layer 16, which may have an opposite doping-type in comparison with fin 10. For example, the dielectric layer 16 may be composed of an n-type doped material, such as arsenic-doped silicate glass (ASG), if the fin 10 is doped p-type or may be composed of a p-type doped material, such as a boron-doped silicate glass (BSG), if the fin 10 is doped n-type.

Figure 5:
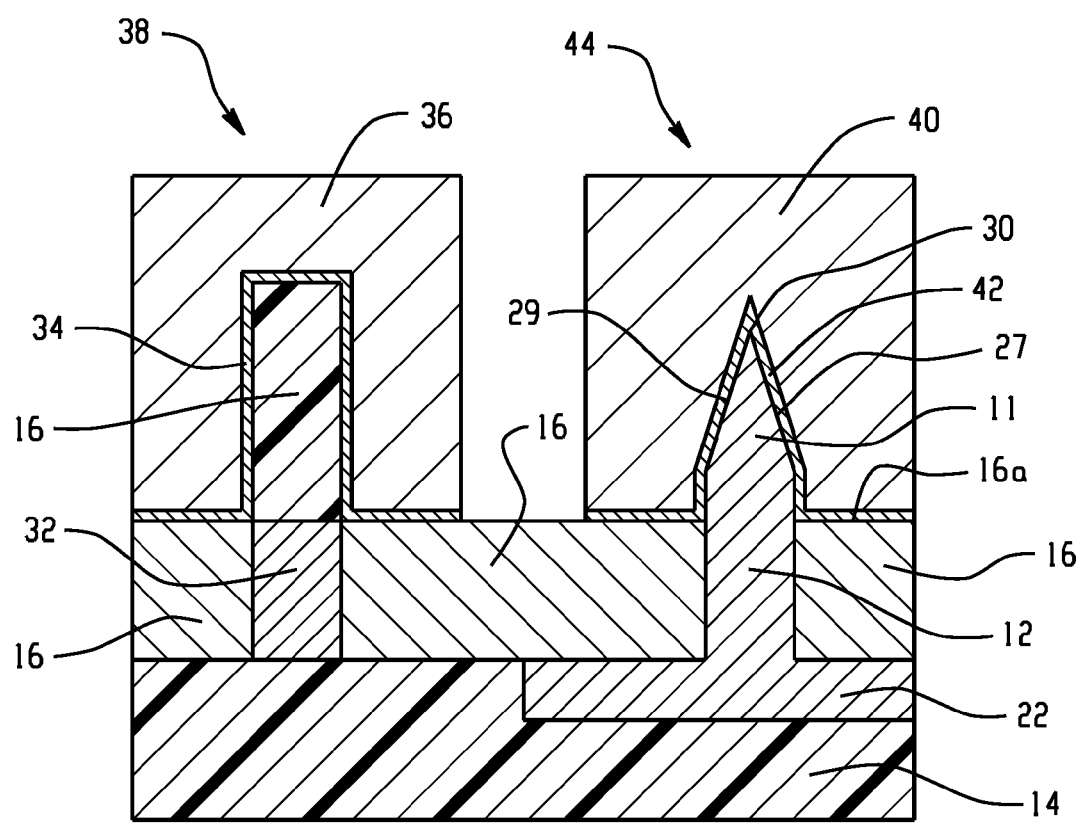

With reference to FIG. 5 in which like reference numerals refer to like features in FIG. 4 and at a subsequent fabrication stage, a gate dielectric 34 and a gate electrode 36 are formed as a gate structure on a portion of the exterior surface of fin 10. The portion of the fin 10 covered by the gate electrode 36 may define a channel of a fin-type field-effect transistor (FinFET) 38. Source and drain regions (not shown) of the fin-type field-effect transistor 38 may be formed in end portions of the fin 10 that are not covered by the gate electrode 36. In an embodiment, the source and drain regions may be formed by dopant diffusion from an epitaxial layer formed on the end portions of the fin 10.

Fin 12 is also covered by a conductive terminal 40, which may be formed from the conductor of the same layer used to form the gate electrode 36 of the fin-type field-effect transistor 38. The terminal 40 is separated from the fin 12 by an isolation dielectric layer 42, which may be formed from the dielectric material of the same layer used to form the gate dielectric 34 of the fin-type field-effect transistor 38. The fin 12 forms another terminal of an anti-fuse 44 in which the terminal represented by the fin 12 is separated from the terminal 40 by the isolation dielectric layer 42. The terminal 40 is located on the inclined surfaces 27, 29 and the edge 30, which are located interior of an exterior surface of the conductive terminal 40. The terminal 40 is separated from the edge 30 and inclined surfaces 27, 29 of the fin 12 by the isolation dielectric layer 42.

The gate dielectric 34 and isolation dielectric layer 42 may be comprised of an electrical insulator with a dielectric constant (e.g., a permittivity) characteristic of a dielectric material. For example, the gate dielectric 34 and isolation dielectric layer 42 may be comprised of silicon dioxide, silicon oxynitride, a high-k dielectric material such as hafnium oxide, or layered combinations of these dielectric materials, deposited by chemical vapor deposition (CVD), atomic layer deposition (ALD), etc. The gate electrode 36 and terminal 40 may be comprised of a metal, a silicide, polycrystalline silicon (e.g., polysilicon), or a combination of these materials deposited by physical vapor deposition (PVD), chemical vapor deposition (CVD), etc.

The gate dielectric 34 and gate electrode 36, as well as the isolation dielectric layer 42 and terminal 40, may be formed by shared processes in which a layered stack of the respective constituent materials is deposited on the fins 10, 12 and the deposited layer stack is subsequently patterned using photolithography and etching processes. To provide the patterning, a mask layer (not shown) may be applied on a top surface of the layer stack and patterned with photolithography. The mask layer may comprise a photosensitive material, such as a photoresist, that is applied by spin coating, pre-baked, exposed to light projected through a photomask, baked after exposure, and developed with a chemical developer. Sections of the mask layer respectively cover the layer stack at the intended locations of the gate electrode 36 and the terminal 40. An etching process is used, with the mask layer present, to simultaneously form the gate dielectric 34, terminal 40, gate electrode 36, and isolation dielectric layer 42 from the layer stack. The etching process may be selected to remove the materials of the layer stack selective to the respective materials of the fins 10, 12 and dielectric layer 16. The etching process may be conducted in a single etching step or multiple steps, and may rely on one or more etch chemistries.

The anti-fuse 44 initially has a relatively high resistance when fabricated and un-programmed. The anti-fuse 44 is designed to permanently create a conductive path that connects its terminals after a programming voltage applied across the electrical device exceeds a threshold level. The terminal 40 of anti-fuse 44 is coupled with a programming voltage source through a back-end-of-line connection and the terminal of anti-fuse 44 represented by the fin 12 is also coupled through the doped region 22 with the programming voltage source. To program the anti-fuse 44, a programming current is generated by applying the programming voltage in one or more pulses across the terminal 40 and the terminal represented by the fin 12. During programming, the programming voltage at which the dielectric material of the isolation dielectric layer 42 exhibits breakdown is reduced because of the existence of the edge 30 and inclined surfaces 27, 29 at the top surface of the fin 12. The electric field strength at and near the edge 30 is locally intensified, which operates to reduce the threshold level for the programming voltage that is required to cause dielectric breakdown of the isolation dielectric layer 42 in comparison with a flat-topped fin acting as a terminal. The edge 30 may have an enhanced surface charge density, which may give rise to the intensified strength for the electric field near the edge 30 and which contrasts with the charge density for the original rectangular shape having a flat top surface and, nominally, right angle corners at the edges of the flat top surface. The programming current causes the anti-fuse 44 to respond by becoming a permanently and irreversibly closed path in which its terminals are connected by a conductive bridge extending through the isolation dielectric layer 42.

In an alternative embodiment, the fin 12 may be sharpened to provide the edge 30 as part of a replacement gate process used to fabricate the FinFET 38 using fin 10. During processing, a dummy gate is located in the space over fin 10 subsequently occupied by the gate electrode 36 and a dummy terminal is located in the space over fin 12 subsequently occupied by the terminal 40. The sharpening is performed after the dummy terminal is removed from its location on the fin 12 to expose the top surface of the fin 12 and before the terminal 40 and gate electrode 36 are concurrently formed.

The anti-fuse 44 can be fabricated with minimal reliance on additional manufacturing steps beyond the complementary metal-oxide-semiconductor (CMOS) processes used to make the FinFET 38. The only extra mask required is in connection with patterning the hardmask layer 20 in anticipation of performing the oxidation sharpening of fin 12.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an anti-fuse, the method comprising:
    forming a first fin;
    forming a dielectric layer that embeds the first fin;
    forming a trench in the dielectric layer, wherein the trench is aligned with the first fin;
    oxidizing a section of the first fin through the trench to form an edge, a plurality of inclined surfaces that intersect at the edge, and an oxide layer covering the edge and the inclined surfaces;
    after the section is oxidized, recessing a top surface of the dielectric layer with an etching process such that the section projects above the top surface of the dielectric layer, wherein the etching process removes the oxide layer from the edge and the inclined surfaces of the first fin to define a first terminal; and
    covering the edge and the inclined surfaces of the first fin with a second terminal and an isolation dielectric layer, wherein the isolation dielectric layer is located between the edge and the inclined surfaces of the first fin and the second terminal.

2. The method of claim 1 comprising:
    before oxidizing the first fin, implanting the first fin with ions.

3. The method of claim 2 wherein the first fin projects from a substrate with a height, the first fin is implanted over an entirety of the height, and further comprising:
    implanting the substrate at a base of the first fin to form a doped region that is connected in series with the first fin.

4. The method of claim 1 comprising:
    forming a second fin concurrently with the formation of the first fin; and
    forming a fin-type field effect transistor using the second fin.

5. The method of claim 4 wherein the fin-type field effect transistor includes a gate electrode formed from the same conductor layer as the second terminal, and the fin-type field effect transistor includes a gate dielectric formed from the same dielectric layer as the isolation dielectric layer.

6. The method of claim 5 wherein the gate electrode and the gate dielectric of the fin-type field effect transistor are concurrently patterned with the second terminal and the isolation dielectric layer.

7. The method of claim 4 comprising:
    covering the second fin with a hardmask and a dielectric cap when forming the trench and oxidizing the upper section of the first fin.

8. The method of claim 1 wherein the first fin includes a top surface and a cap on the top surface, the dielectric layer has a thickness that is equal to a height of the first fin and the cap, and forming the trench in the dielectric layer comprises:
    after forming the dielectric layer, removing the cap from the first fin to define the trench.

* * * * *

UNITED STATES PATENT AND TRADEMARK OFFICE
CERTIFICATE OF CORRECTION

PATENT NO.        : 9,852,982 B1
APPLICATION NO.   : 15/189432
DATED             : December 26, 2017
INVENTOR(S)       : Chengwen Pei et al.

Page 1 of 1

It is certified that error appears in the above-identified patent and that said Letters Patent is hereby corrected as shown below:

In the Claims

Column 8, Claim 1, Line 15, change "after the section is oxidized" to --after oxidizing the section--

Signed and Sealed this
Twenty-ninth Day of May, 2018

Andrei Iancu
*Director of the United States Patent and Trademark Office*